(12) United States Patent
Hsu

(10) Patent No.: US 9,734,736 B2
(45) Date of Patent: Aug. 15, 2017

(54) ELECTRONIC DEVICE HAVING SELF-EMITTING DISPLAY PANEL

(71) Applicant: AU Optronics Corp, Hsin-Chu (TW)

(72) Inventor: Hsu-Sheng Hsu, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 329 days.

(21) Appl. No.: 14/159,892

(22) Filed: Jan. 21, 2014

(65) Prior Publication Data

US 2015/0009634 A1    Jan. 8, 2015

(30) Foreign Application Priority Data

Jul. 2, 2013 (TW) .............................. 102123644 A
Sep. 13, 2013 (TW) .............................. 102133246 A

(51) Int. Cl.
| | |
|---|---|
| *H05K 7/14* | (2006.01) |
| *G09F 9/33* | (2006.01) |
| *G09F 13/22* | (2006.01) |
| *H01L 51/52* | (2006.01) |

(52) U.S. Cl.
CPC .............. *G09F 9/33* (2013.01); *G09F 13/22* (2013.01); *H05K 7/14* (2013.01); *H01L 51/5246* (2013.01)

(58) Field of Classification Search
CPC ... H01L 51/524; H01L 51/5237; H01L 51/50; G09F 13/00
USPC ............................................ 361/679.21, 748
See application file for complete search history.

(56) References Cited

U.S. PATENT DOCUMENTS

| | | | |
|---|---|---|---|
| 6,042,243 A | 3/2000 | Grill et al. | |
| 7,551,458 B2 | 6/2009 | Carnevali et al. | |
| 2004/0120104 A1* | 6/2004 | Jeong ................ | G02F 1/133308 361/679.21 |

(Continued)

FOREIGN PATENT DOCUMENTS

| | | |
|---|---|---|
| CN | 1510465 | 7/2004 |
| CN | 202976703 U | 6/2013 |

(Continued)

OTHER PUBLICATIONS

China Patent Office, "Office Action," Aug. 5, 2015.
China Patent Office "Office Action", Feb. 2, 2016, China.

*Primary Examiner* — Jenny L Wagner
*Assistant Examiner* — Jessey R Ervin
(74) *Attorney, Agent, or Firm* — WPAT, PC

(57) ABSTRACT

An electronic device includes a self-emitting display panel, a first transparent substrate, a second transparent substrate and two combining elements. The first transparent substrate includes two first edge portions and a first cover portion. The second transparent substrate includes two second edge portions and a second cover portion. The self-emitting display panel is disposed between the first cover portion and the second cover portion. The self-emitting display panel has a first surface facing to and covered entirely by the first cover portion and a second surface facing to and covered entirely by the second cover portion. One of the two combining elements is connected between one of the two first edge portions and one of the two second edge portions, and the other of the two combining elements is connected between the other of the two first edge portions and the other of the two second edge portions.

10 Claims, 7 Drawing Sheets

(56) References Cited

U.S. PATENT DOCUMENTS

| | | | | |
|---|---|---|---|---|
| 2005/0200268 | A1* | 9/2005 | Tanaka | H01L 25/048 313/498 |
| 2008/0297042 | A1* | 12/2008 | Ahn | H01L 27/3251 313/504 |
| 2013/0063891 | A1* | 3/2013 | Martisauskas | G06F 1/1643 361/679.56 |

FOREIGN PATENT DOCUMENTS

| | | |
|---|---|---|
| JP | 2006235092 A | 9/2006 |
| JP | 2011029142 A | 2/2011 |
| JP | 2012088731 A | 5/2012 |
| TW | I338529 B | 3/2011 |
| TW | 201142408 A | 12/2011 |

* cited by examiner

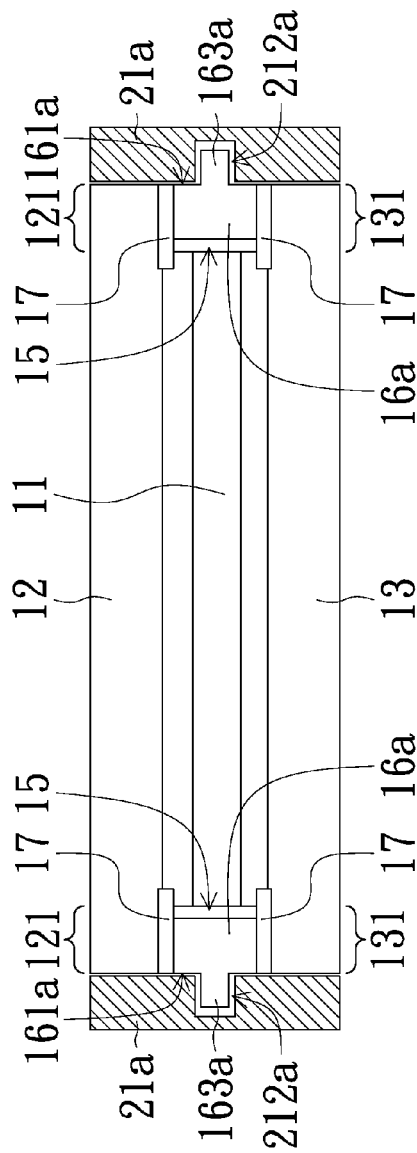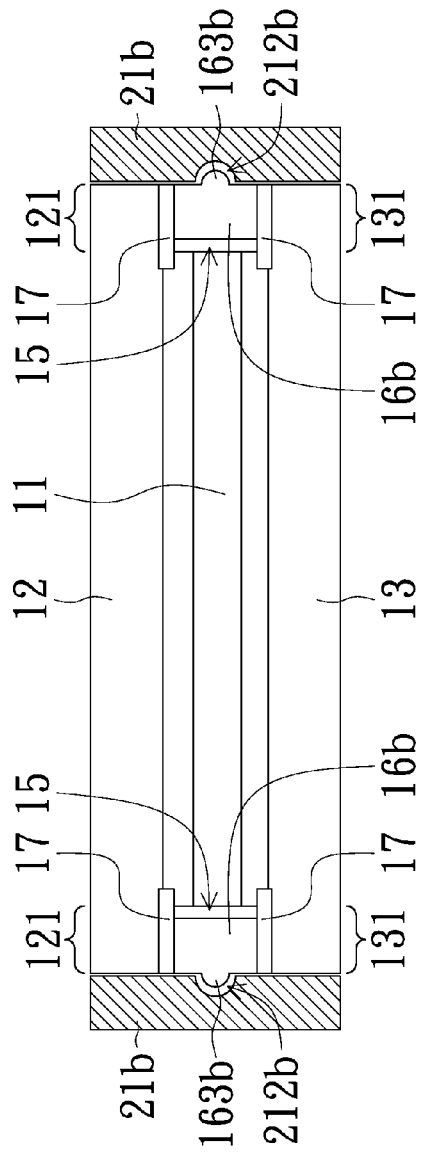

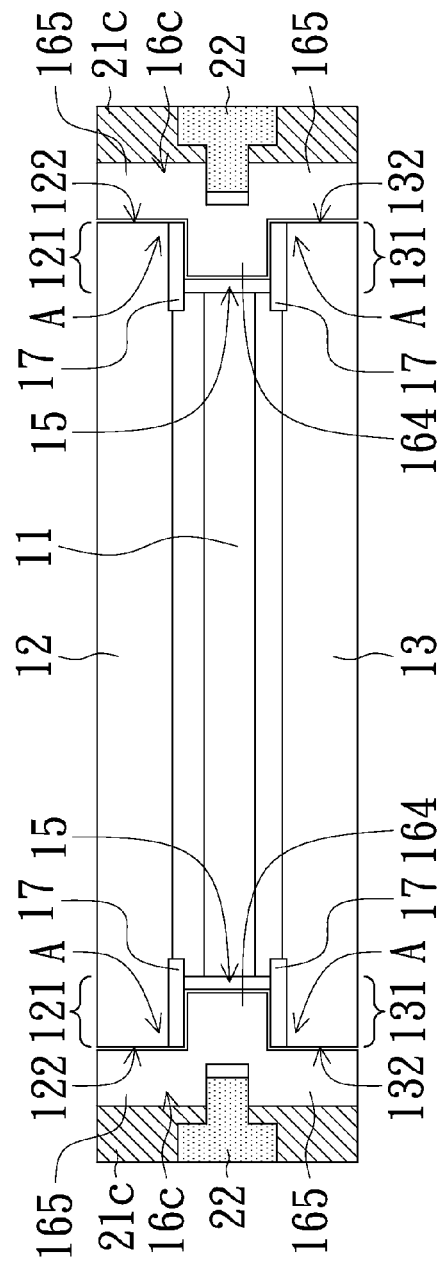

ELECTRONIC DEVICE HAVING SELF-EMITTING DISPLAY PANEL

FIELD OF THE INVENTION

The present invention relates to an electronic device, and particularly to an electronic device having a self-emitting display panel.

BACKGROUND OF THE INVENTION

An organic light emitting diode generates light by electrically exciting a fluorescent or phosphorescent organic light-emitting layer, which has advantages of self-luminous property, low power consumption, high reaction rate, etc. Currently, the organic light emitting diode has attracted wide attention of manufacturers in the display field and the lighting filed.

Due to the self-luminous property, it is not necessary for a flat panel display having the organic light emitting diode to be equipped with an external light source such as backlight module to supply the light. That is, the flat panel display having the organic light emitting diode can display an image without the external light source. Thus, the flat panel display having the organic light emitting diode is adapted to be developed into a transparent display.

However, a structural strength of the above-mentioned transparent display is usually insufficient. When the transparent display is fixed to a frame of an electronic device, it is usually required to increase the whole structural strength of the transparent display. In a conventional fixing structure, a fixing portion is generally protruded from a front surface (a display surface) of the transparent display or the rear surface. As a result, the transparent display using the conventional fixing structure can not be a fully planar design.

SUMMARY OF THE INVENTION

The present invention provides an electronic device, which can enhance a structural strength of a self-emitting display panel included in the electronic device, thereby achieving a fully planar design of a self-emitting display panel.

The present invention provides an electronic device including a self-emitting display panel, a first transparent substrate, a second transparent substrate and two combining elements. The first transparent substrate includes two first edge portions and a first cover portion between the two first edge portions. The second transparent substrate includes two second edge portions and a second cover portion between the two second edge portions. The self-emitting display panel is disposed between the first cover portion and the second cover portion. The self-emitting display panel has a first surface facing to the first cover portion and a second surface facing to the second cover portion, and the first surface and the second surface are respectively covered by the first cover portion and the second cover portion entirely. One of the two combining elements is connected between one of the two first edge portions and one of the two second edge portions corresponding to the one of the two first edge portions, and the other of the two combining elements is connected between the other of the two first edge portions and the other of the two second edge portions corresponding to the other of the two first edge portions.

In one embodiment provided by the present invention, the electronic device further includes a frame. The frame has at least two side columns opposite to each other and separated from each other in a distance. The two side columns are engaged with the two combining elements respectively.

In one embodiment provided by the present invention, each of the two combining elements includes a first engaging portion located at a side thereof far away from the self-emitting display panel, and each of the two side columns includes a second engaging portion. The second engaging portion is engaged with the first engaging portion.

In one embodiment provided by the present invention, the one of the two combining elements has a fixing portion located in a space formed by the one of the two first edge portions of the first transparent substrate, the one of the two second edge portions of the second transparent substrate corresponding to the one of the two first edge portions and the self-emitting display panel, the other of the two combining elements has a fixing portion located in a space formed by the other of the two first edge portions of the first transparent substrate, the other of the two second edge portions of the second transparent substrate corresponding to the other of the two first edge portions and the self-emitting display panel.

In one embodiment provided by the present invention, each of the two combining elements further includes two protruding portions protruding from the corresponding fixing portion outside the corresponding space. A receiving space is defined between each of the two protruding portions and the corresponding fixing portion. The receiving spaces are configured for receiving the two first edge portions of the two second edge portions respectively.

In one embodiment provided by the present invention, each of the two combining elements further includes two extending portions. The two extending portions are respectively connected to the two protruding portions. One of the two extending portions covers a surface of the one of the two first edge portions far away from the self-emitting display panel, the other of the two extending portions covers a surface of the one of the two second edge portions far away from the self-emitting display panel.

In one embodiment provided by the present invention, a length of each of the two first edge portions is greater than a length of each of the two second edge portions. Each of the two combining elements is substantially located in an orthographic projection region of each of the two first edge portion on the corresponding one of the two second edge portions.

In one embodiment provided by the present invention, a length of each of the two first edge portions is greater than a length of each of the two second edge portions. Each of the two side columns and the corresponding one of the two combining elements are substantially located in an orthographic projection region of each of the two first edge portion on the corresponding one of the two second edge portions.

In one embodiment provided by the present invention, each of the first transparent substrate and the second transparent substrate is trapezoidal and has a top surface and a bottom surface. The bottom surface has a larger area than the top surface. The bottom surface of the first transparent substrate faces to the bottom surface of the second transparent substrate.

In one embodiment provided by the present invention, each of the first transparent substrate and the second transparent substrate is trapezoidal and has a top surface and a bottom surface. The bottom surface has a larger area than the top surface. The top surface of the first transparent substrate faces to the top surface of the second transparent substrate.

In one embodiment provided by the present invention, the electronic device further includes a number of light shielding layers disposed on two inner surfaces of the two first edge portions of the first transparent substrate and two inner surfaces of the two second edge portions of the second transparent substrate.

According to the present invention, because the self-emitting display panel is disposed between the first transparent substrate and the second transparent substrate, the structural strength of the self-emitting display panel can be enhanced by the first transparent substrate and the second transparent substrate. In addition, because the combining elements are located between the first edge portion of the first transparent substrate and the corresponding second edge portion of the second transparent substrate, the combining elements can be avoiding being protruded from the outer surfaces (i.e., surfaces far away from the self-emitting display panel) of the first transparent substrate and the second transparent substrate. Thus, the electronic device can be a fully planar design.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4 illustrates a cross-sectional, schematic view of an electronic device in accordance with another embodiment of the present invention.

FIG. 5 illustrates a cross-sectional, schematic view of an electronic device in accordance with another embodiment of the present invention.

FIG. 6 illustrates a cross-sectional, schematic view of an electronic device in accordance with another embodiment of the present invention.

FIG. 7 illustrates a cross-sectional, schematic view of an electronic device in accordance with an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
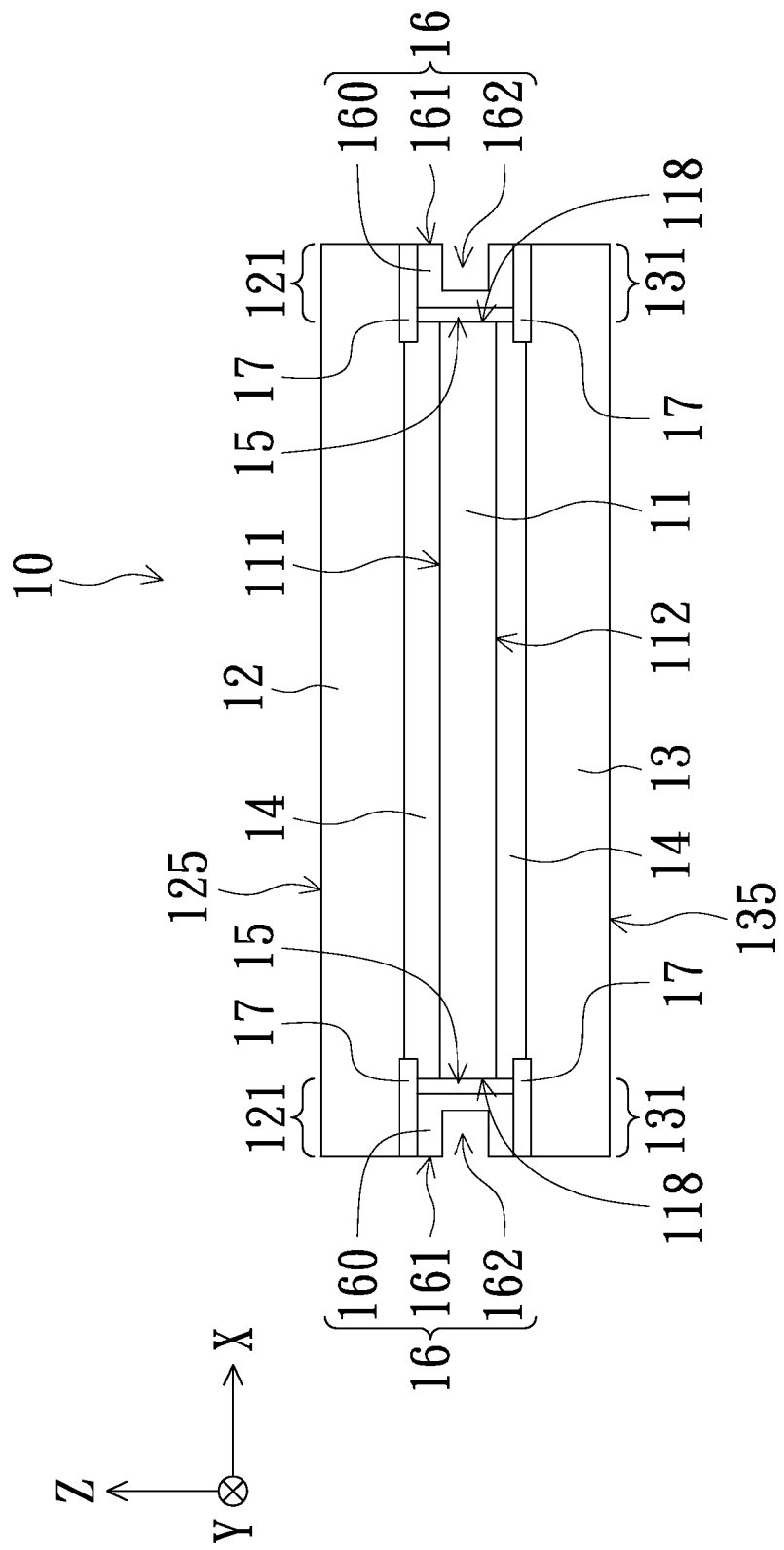
FIG. 1 illustrates a cross-sectional, schematic view of an electronic device in accordance with an embodiment of the present invention.

FIG. 1 illustrates a cross-sectional, schematic view of an electronic device 10 in accordance with an embodiment of the present invention. Referring to FIG. 1, the electronic device 10 includes a self-emitting display panel 11, a first transparent substrate 12, a second transparent substrate 13 and to two combining elements 16.

The self-emitting display panel 11 can be, for example, an organic light emitting diode display panel or other types of display panel. The self-emitting display panel 11 has a first surface 111 and a second surface 112 opposite to the first surface 111. The first transparent substrate 12 is disposed above the first surface 111 and covers the first surface 111 entirely. The second transparent substrate 13 is disposed above the second surface 112 and covers the second surface 112 entirely.

Figure 2:
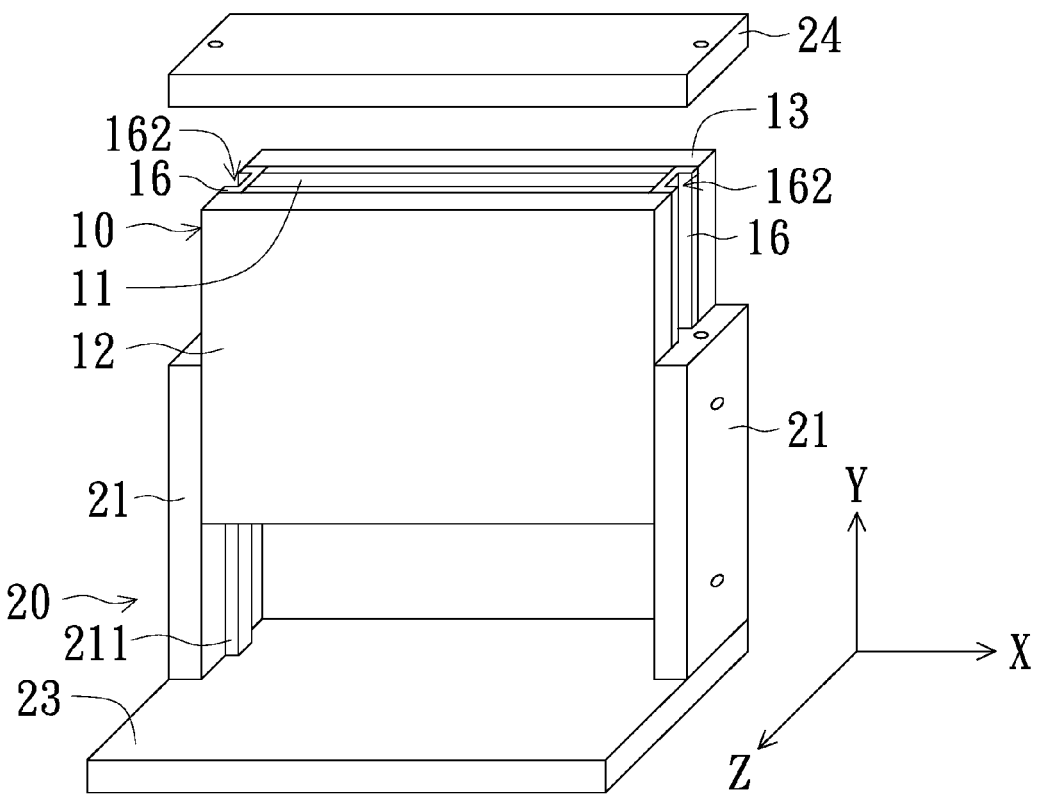
FIG. 2 illustrates a perspective, schematic view of an electronic device in accordance with another embodiment of the present invention.

FIG. 2 illustrates a perspective, schematic view of an electronic device in accordance with another embodiment of the present invention. Comparative to the electronic device 10 shown in FIG. 1, the electronic device shown in FIG. 2 further includes a frame 20. In other words, the electronic device shown in FIG. 2 includes the electronic device 10 shown in FIG. 1 and the frame 20. Referring to FIG. 1 and FIG. 2, the self-emitting display panel 11, the first transparent substrate 12 and the second transparent substrate 13 each has, for example, a rectangular configuration. It is noted that, a size of each of the first transparent substrate 12 and the second transparent substrate 13 is greater than a size of the self-emitting display panel 11. In detail, a width along a Y axis of each of the first transparent substrate 12 and the second transparent substrate 13 is substantially equal to a width along the Y axis of the self-emitting display panel 11. A length along a X axis of each of the first transparent substrate 12 and the second transparent substrate 13 is greater than a length along the X axis of the self-emitting display panel 11.

A geometric center of the first transparent substrate 12 and a geometric center of the second transparent substrate 13 are aligned with a geometric center of the self-emitting display panel 11 along a Z axis. Thus, the first transparent substrate 12 includes two first edge portions 121 and a first cover portion 125 between the two first edge portions 121. The two first edge portions 121 respectively exceed two opposite sides of the self-emitting display panel 11. The second transparent substrate 13 includes two second edge portions 131 and a second cover portion 135 between the two second edge portion 131. The two second edge portions 131 also respectively exceed the two opposite sides of the self-emitting display panel 11. The first surface 111 of the self-emitting display panel 11 faces to the first cover portion 125 and is entirely covered by the first cover portion 125, and the second surface 112 of the self-emitting display panel 11 faces to the second cover portion 135 and is entirely covered by the second cover portion 135.

In the present embodiment, the two first edge portions 121 have an identical length along the X axis, and the two second edge portions 131 also have an identical length along the X axis. In another embodiment, the two first edge portions 121 can have different lengths along the X axis, and the two second edge portions 131 can also have different lengths along the X axis.

Additionally, in the present embodiment, the length along the X axis of each of the first edge portions 121 is substantially equal to the length along the X axis of each of the second edge portions 131. In another embodiment, the length along the X axis of each of the first edge portions 121 can be unequal to the length along the X axis of each of the second edge portions 131.

In the present embodiment, the length along the X axis of each of the first transparent substrate 12 and the second transparent substrate 13 is greater than the length along the X axis of the self-emitting display panel 11, the width along the Y axis of each of the first transparent substrate 12 and the second transparent substrate 13 is equal to the width along the Y axis of the self-emitting display panel 11. It is noted that, the width along the Y axis of each of the first transparent substrate 12 and the second transparent substrate 13 can be greater than the width along the Y axis of the self-emitting display panel 11, and the length along the X axis of each of the first transparent substrate 12 and the second transparent substrate 13 can be equal to the length along the X axis of the self-emitting display panel 11. In other words, a size along one of the X axis (a direction in length) and the Y axis (a direction in width) of the first transparent substrate 12 is greater than a size correspondingly along the one of the X axis and the Y axis of the self-emitting display panel 11. Similarly, a size correspondingly along the one of the X axis and the Y axis of the second transparent substrate 13 is also greater than the size correspondingly along the one of the X axis and the Y axis of the self-emitting display panel 11.

The first transparent substrate 12 and the second transparent substrate 13 can be respectively disposed above the first surface 111 and the second surface 112 of the self-emitting display panel 11 by using an optical clear adhesive (OCA) 14. In detail, the optical clear adhesive 14 is disposed between the first transparent substrate 12 and the first surface 111 of self-emitting display panel 11 so that the first transparent substrate 12 is adhered to the first surface 111 of self-emitting display panel 11 by the optical clear adhesive 14. The optical clear adhesive 14 is also disposed between the second transparent substrate 13 and the second surface 112 of the self-emitting display panel 11 so that the second transparent substrate 13 is adhered to the second surface 112 of self-emitting display panel 11 by the optical clear adhesive 14. The optical clear adhesive 14 can be a liquid optical clear adhesive or a solid optical clear adhesive tape.

Again, referring to FIG. 1, one of the two combining elements 16 is connected between one of the two first edge portions 121 and one of the two second edge portions 131 corresponding to the one of the two first edge portions 121. The other of the two combining elements 16 is connected between the other of the two first edge portions 121 and the other of the two second edge portions 131 corresponding to the other of the two first edge portions 121. In detail, on the one side of the electronic device 10, the first edge portions 121, the corresponding second edge portion 131 and one sidewall 118 of the self-emitting display panel 11 form a space 15 in groove-shaped. That is, the first edge portion 121, the second edge portion 131 and the one sidewall 118 of the self-emitting display panel 11 on the same side of the electronic device 10 cooperate with each other to form the space 15. Similarly, on the other side of the electronic device 10, the other first edge portions 121, the other corresponding second edge portion 131 and the other sidewall 118 of the self-emitting display panel 11 on the other side of the electronic device 10 cooperate with each other to form the other space 15 in groove-shaped.

Each of the two combining elements 16 includes a fixing portion 160. In the present embodiment, the fixing portion 160 is, for example, a strip. The fixing portion 160 is disposed in the space 15, and a lengthwise extending direction of the fixing portion 160 is parallel to the Y axis. Each of the two combining elements 16 has a first engaging portion 162. In the present embodiment, the first engaging portion 162 is, for example, a groove located at a side of the combining element 16 far away from the self-emitting display panel 11. That is, the groove is defined at an outer surface 161 of the combining element 16, and the outer surface 161 is a surface exposed from the space 15. A lengthwise extending direction of each of the groove is parallel to the Y axis. The first engaging portion 162 of the fixing portion 16 be is configured for being assembled to the frame 20.

In addition, each of the first transparent substrate 12 and the second transparent substrate 13 can further includes a number of light shielding layers 17. The light shielding layers 17 are disposed on inner surfaces of the first edge portion 121 and the second edge portion 131. The light shielding layers 17 are configured for shielding the combining elements 16 in the space 15 and reflecting the light incident to the combining elements 16 so that a user can not see the combining elements 16 directly.

For example, referring to FIG. 2, the frame 20 includes two side columns 21 opposite to each other. The two side columns 21 are separated from each other in a distance so that the electronic device 10 can be tightly mounted between the two side columns 21. A lengthwise extending direction of each of the side columns 21 is parallel to the Y axis. In detail, each of the side columns 21 has, for example, a second engaging portion 211. A lengthwise extending direction of each of the second engaging portion 211 is parallel to the Y axis. In the present embodiment, the second engaging portion 211 is, for example, a convex part corresponding to the first engaging portion 162. The second engaging portions 211 of the two side columns 21 are respectively engaged with the first engaging portions 162 of the two combining elements 16, so that the second engaging portions 211 are respectively located in the first engaging portions 162. The combining elements 16 together with the electronic device 10 can slide downward along the Y axis from an upper end of the two side columns 21 to a lower end of the two side columns 21. Thus, the electronic device 10 can be assembled to the frame 20 easily.

Because the first transparent substrate 12 and the second transparent substrate 13 are respectively disposed on the first surface 111 and the second surface 112 of the self-emitting display panel 11, and the combining elements 16 are located between the first transparent substrate 12 and the second transparent substrate 13 and respectively located at the right side and the left side of the self-emitting display panel 11, the self-emitting display panel 11 can have sufficient structural strength. Thus, the self-emitting display panel 11 can be protected from damage by an external force.

Furthermore, because the combining elements 16 are respectively located at two sides of the self-emitting display panel 11, the combining elements 16 can be simply assembled to the frame 20 via the first engaging portions 162 in a slidable manner.

Additionally, because the combining elements 16 is substantially located between the first transparent substrate 12 and the second transparent substrate 13 and are not protruded from the space 15, a width along the X axis of the electronic device 10 shown in FIG. 2 is equal to the distance between the two side columns 21 of the frame 20. That is, the widths of the combining elements 16 can be omitted, and the combining elements 16 will not affect the width along the X axis of the electronic device 10 shown in FIG. 2. Thus, the electronic device 10 can have an advantage of narrow border. Moreover, the combining elements 16 are not protruded from an outer surface (a surface far away from the self-emitting display panel 11) of each of the first transparent substrate 12 and the second transparent substrate 13. Further, a surface of each of the side columns 21 parallel to a XY plane defined by the X axis and the Y axis can also be coplanar with the outer surface of each of the first transparent substrate 12 and the second transparent substrate 13. Thus, the electronic device 10 can be a double fully planar design.

Figure 3:
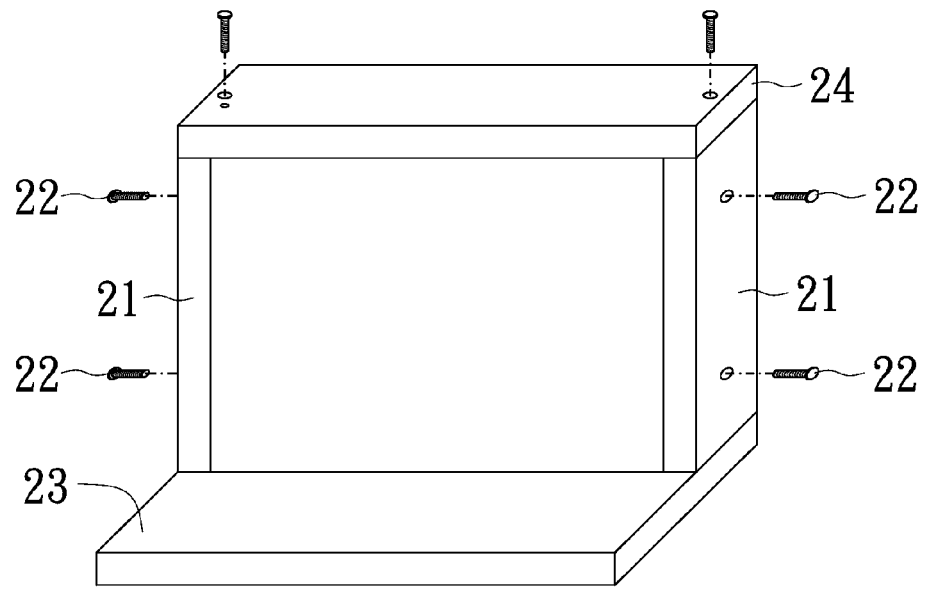
FIG. 3 illustrates an assembly, schematic view of the electronic device shown in FIG. 2.

FIG. 3 illustrates an assembly, schematic view of the electronic device shown in FIG. 2. Referring to FIG.2 and FIG. 3, after the electronic device 10 is assembled into the frame 20, the combining elements 16 can be fixed to the corresponding side plate 21 by using a number of fastening members 22.

As shown in FIG. 2 and FIG. 3, the frame 20 includes a base plate 23 and a cover plate 24. It is noted that, in another embodiment, the base plate 23 and the cover plate 24 can all be omitted. It is also noted that, in still another embodiment, the frame 20 can optionally include one of the base plate 23 and the cover plate 24. Moreover, the configuration of the frame is not limited by the frame 20 shown in FIG. 2 and FIG. 3.

FIG. 4 illustrates a cross-sectional, schematic view of an electronic device in accordance with another embodiment of the present invention. Referring to FIG. 4, the electronic device in the present embodiment is similar to the electronic device 10 shown in FIG. 2 except the first engaging portions of the combining elements and the second engaging portions of the side columns. In detail, in the present embodiment, each of the first engaging portions 163a of the combining elements 16a is, for example, a convex part, which is protruded from an outer surface 161a. A cross-sectional shape of each of the first engaging portions 163a is, for example, a rectangular. Each of the second engaging portions 212a of the side columns 21a is, for example, a groove corresponding to the first engaging portion 163a. A cross-sectional shape of each of the second engaging portions 212a is correspondingly a rectangular.

FIG. 5 illustrates a cross-sectional, schematic view of an electronic device in accordance with another embodiment of the present invention. Referring to FIG. 5, the electronic device in the present embodiment is similar to the electronic device shown in FIG. 4 except the first engaging portions of the combining elements and the second engaging portions of the side columns. In detail, in the present embodiment, a cross-sectional shape of each of the first engaging portions 163b of the combining elements 16b is, for example, a semicircular. A cross-sectional shape of each of the second engaging portions 212b is correspondingly a semicircular. Additionally, the first engaging portion is engaged with the second engaging portion by means of a cooperation of the convex part and the groove. Thus, a cross-sectional shape of the convex part can be, but not limited to, semielliptic, triangular, and other suitable shapes, and a cross-sectional shape of the groove can be a shape cooperated with the convex part.

FIG. 6 illustrates a cross-sectional, schematic view of an electronic device in accordance with another embodiment of the present invention. Referring to FIG. 6, the electronic device in the present embodiment is similar to the electronic device shown in FIG. 4 except the combining elements and the side columns. In detail, in the present embodiment, a cross-sectional shape of each combining element 16c is substantially T-shaped. Each combining element 16c includes a fixing portion 164 and two protruding portions 165. The fixing portion 164 is located inside the space 15, and the two protruding portions 165 are protruded from and located outside the space 15. A receiving space A is defined by each of the protruding portions 165 and the corresponding fixing portion 164. The receiving spaces A are configured for respectively receiving the first edge portions 121 and the second edge portions 131. The protruding portions 165 cover a side surface 122 of each of the first edge portions 121 of the first transparent substrate 12 and a side surface 132 of each of the second edge portions 131 of the second transparent substrate 13. Additionally, the electronic device can further includes a number of fastening members 22 so that the side plate 21c can be fixed to the corresponding combining element 16c by using the corresponding fastening member 22.

FIG. 7 illustrates a cross-sectional, schematic view of an electronic device in accordance with another embodiment of the present invention. Referring to FIG. 7, the electronic device in the present embodiment is similar to the electronic device shown in FIG. 6 except the side columns. In detail, in the present embodiment, each side plate 21d induces two extending portions 213. The two extending portions 213 are respectively located at and contacted with an upper side and a lower side of the protruding portion 165d of a corresponding combining element 16d. Thus, the side plate 21d can be directly engaged with the corresponding combining element 16d, thereby omitting the fixing member 22 shown in FIG. 6.

Figure 8:
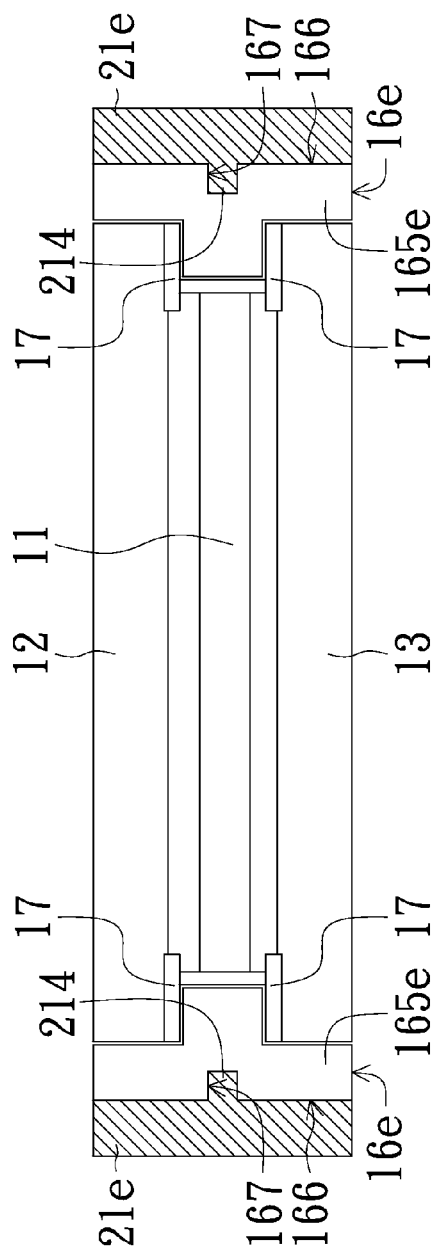
FIG. 8 illustrates a cross-sectional, schematic view of an electronic device in accordance with an embodiment of the present invention.

FIG. 8 illustrates a cross-sectional, schematic view of an electronic device in accordance with another embodiment of the present invention. Referring to FIG. 8, the electronic device in the present embodiment is similar to the electronic device shown in FIG. 6 except a fixing manner of the combining elements and the side columns. In detail, in the present embodiment, a protruding portion 165e of each combining element 16e has a first engaging portion 167 (e.g., a groove). The first engaging portion 167 is located at an outer surface 166 of the combining element 16e. The outer surface 166 is a surface far away from the self-emitting display panel 11. Each side plate 21e of the frame has a second engaging portion 214 (i.e., a convex part) corresponding to the first engaging portion 167. The first engaging portion 167 is engaged with the second engaging portion 214 so that the side plate 21e is fixed to the combining element 16e.

Figure 9:
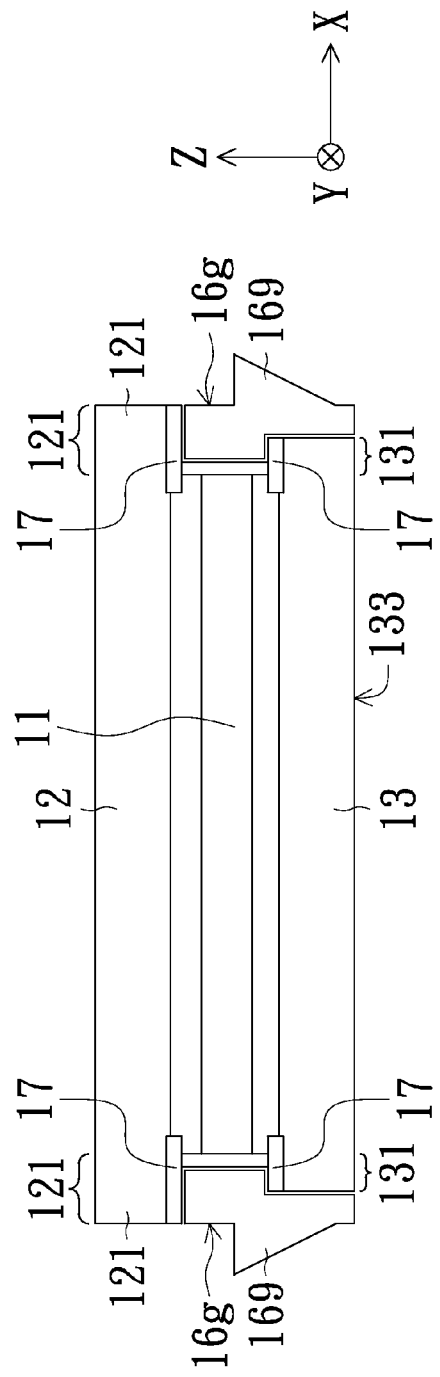
FIG. 9 illustrates a cross-sectional, schematic view of a self-emitting display panel in accordance with an embodiment of the present invention.

FIG. 9 illustrates a cross-sectional, schematic view of an electronic device in accordance with another embodiment of the present invention. Referring to FIG. 9, in the present embodiment, the length along the X axis of the first transparent substrate 12 is greater than the length along the X axis of the second transparent substrate 13. Thus, the length along the X axis of each of the two first edge portion 121 is greater than the length along the X axis of each of the two second edge portions 131. Each combining element 16g is substantially located in an orthographic projection region of the first edge portions 121 on the corresponding second edge portion 131. In addition, each combining element 16g are not protruded from an outer surface 133 of the second transparent substrate 13. The outer surface 133 of the second transparent substrate 13 is a surface far away from the self-emitting display panel 11. Additionally, each combining element 16g includes an protruded outside engaging portion 169. The protruded outside engaging portion 169 is cooperated with the corresponding structure of the frame so that the frame is fixed to the combining element 16g. Thus, the structure of the protruded outside engaging portion 169 can be designed according to the structure of the frame.

Figure 10:
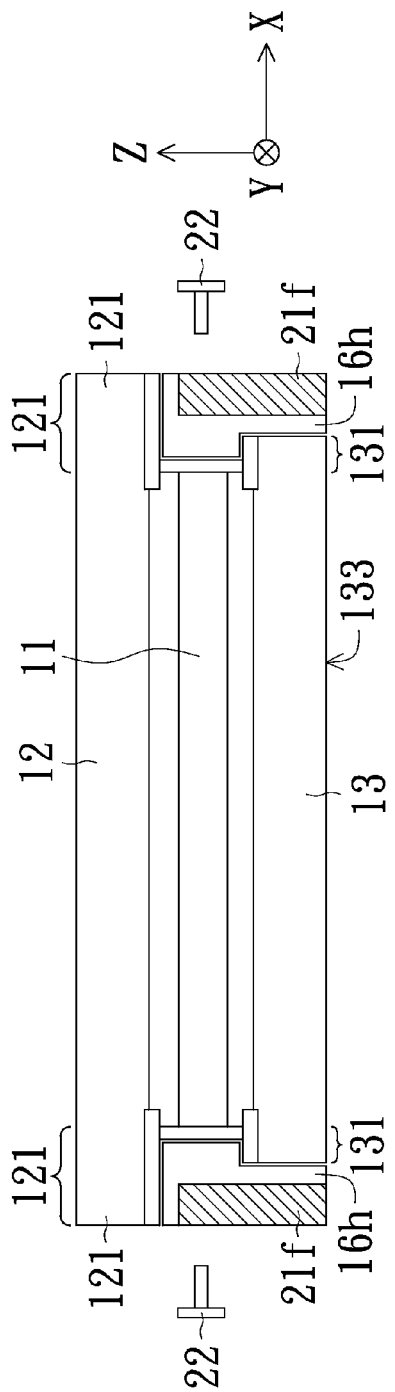
FIG. 10 illustrates a cross-sectional, schematic view of an electronic device in accordance with an embodiment of the present invention.

FIG. 10 illustrates a cross-sectional, schematic view of an electronic device in accordance with another embodiment of the present invention. Referring to FIG. 10, in the present embodiment, the length along the X axis of the first transparent substrate 12 is greater than the length along the X axis of the second transparent substrate 13. Thus, the length along the X axis of each of the two first edge portion 121 is greater than the length along the X axis of each of the two second edge portions 131. Each side plate 21f and the corresponding combining element 16h are substantially located in the orthographic projection region of the first edge portions 121 on the corresponding second edge portion 131. When a user looks the electronic device from a side where the first transparent substrate 12 is located, only the first transparent substrate 12 can be saw. That is, any frame can not be seen from the side where the first transparent substrate 12 is located. Thus, the electronic device in the present embodiment can have an advantage of no frame.

Additionally, the electronic device further includes a number of fastening members 22 so that the side plate 21f can be fixed to the corresponding combining element 16h by using the corresponding fastening member 22. It is noted that, each combining element 16h and each side plate 21 f are not protruded from the outer surface 133 of the second transparent substrate 13. The outer surface 133 of the second transparent substrate 13 is a surface far away from the self-emitting display panel 11. Thus, the electronic device 10 can be a double fully planar design.

Figure 11:
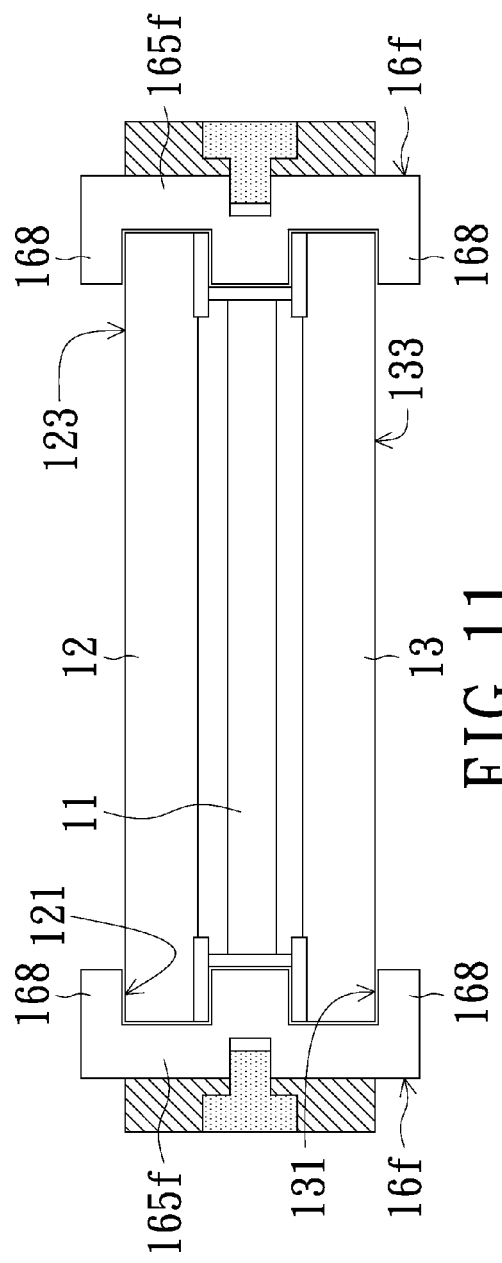
FIG. 11 illustrates a cross-sectional, schematic view of an electronic device in accordance with an embodiment of the present invention.

FIG. 11 illustrates a cross-sectional, schematic view of an electronic device in accordance with another embodiment of the present invention. Referring to FIG. 11, comparative to FIG. 6, in the present embodiment, each combining element 16f further includes two extending portions 168. The two extending portions 168 are respectively connected to two protruding portions 165f. One of the two extending portions 168 covers a surface of the first edge portion 121 far away from the self-emitting display panel 11. That is, the one of the two extending portions 168 covers an edge portion of an outer surface 123. The other of the two extending portions 168 covers a surface of the second edge portion 131 far away from the self-emitting display panel 11. That is, the one of the two extending portions 168 covers an edge portion of the outer surface 133.

Figure 12:
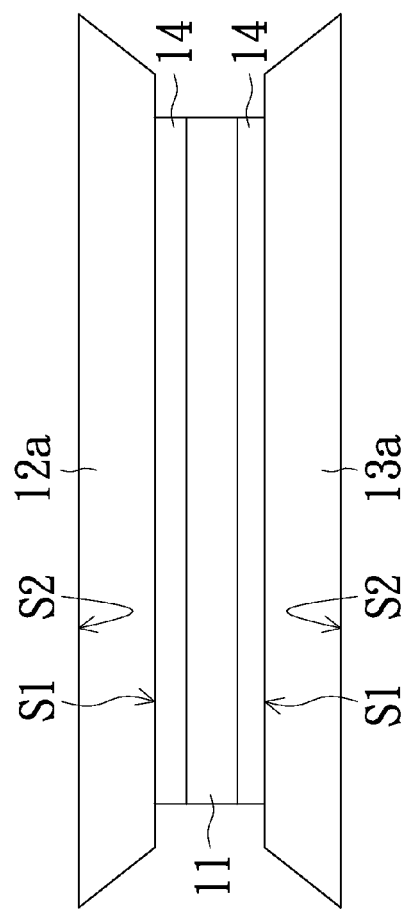
FIG. 12 illustrates a cross-sectional, schematic view of an electronic device in accordance with an embodiment of the present invention.
Figure 13:
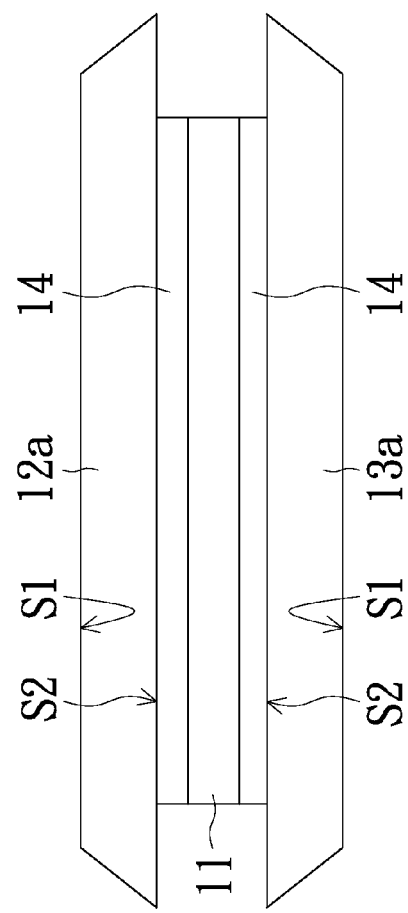
FIG. 13 illustrates a cross-sectional, schematic view of an electronic device in accordance with an embodiment of the present invention.

In the above embodiments, each of the first transparent substrate 12 and the second transparent substrate 13 is, for example, rectangular. It is noted that, the first transparent substrate 12 and the second transparent substrate 13 can be other suitable shapes. FIG. 12 illustrates a cross-sectional, schematic view of an electronic device in accordance with another embodiment of the present invention. Referring to FIG. 12, the combining elements are not shown in FIG. 12. Each of the first transparent substrate 12a and the second transparent substrate 13a is, for example, trapezoidal. Each of the first transparent substrate 12a and the second transparent substrate 13a has a top surface S1 and a bottom surface S2. It is noted that, the top surface S1 and the bottom surface S2 are not defined according to the relative location, but defined according to the area. Because the first transparent substrate 12a and the second transparent substrate 13a each have a slit surface on a lateral margin, the area of the top surface Si is different from the area of the bottom surface S2. It is noted that, the bottom surface S2 has a larger area than the top surface S1. The top surface S1 of the first transparent substrate 12a faces to the top surface S1 of the second transparent substrate 13a. In another embodiment, as shown in FIG. 13, the bottom surface S2 of the first transparent substrate 12a faces to the bottom surface S2 of the second transparent substrate 13a.

In summary, the present invention at least has the flowing advantages:

1. Because the first transparent substrate and the second transparent substrate are respectively disposed on the first surface and the second surface of the self-emitting display panel, and the combining elements are located between the first transparent substrate and the second transparent substrate and respectively located at the right side and the left side of the self-emitting display panel, the self-emitting display panel has sufficient structural strength. Thus, the self-emitting display panel can be protected from damage by an external force.

2. Because the combining elements correspond to and are cooperated with the side columns of the frame, the electronic device having the combining element can be simply and exactly assembled into the frame.

3. Because the combining elements are located between the first transparent substrate and the second transparent substrate, the user can not see the combining elements but see the side columns of the frame only. Thus, the width of the electronic device do not includes the width of the combining elements, so that the electronic device has a narrow frame.

4. Because the combining elements do not protrude from the outer surfaces of the first transparent substrate and the second transparent substrate far away from the self-emitting display panel, the surfaces of the side columns parallel to the outer surfaces can also be respectively coplanar with the outer surfaces the first transparent substrate and the second transparent substrate. Thus, the electronic device can be a double fully planar design.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An electronic device, comprising:
    a first transparent substrate, comprising two first edge portions and a first cover portion between the two first edge portions;
    a second transparent substrate, comprising two second edge portions and a second cover portion between the two second edge portions;
    a self-emitting display panel, disposed between the first cover portion and the second cover portion, wherein the self-emitting display panel has a first surface facing to the first cover portion and a second surface facing to the second cover portion, and the first surface and the second surface are respectively covered by the first cover portion and the second cover portion entirely;
    two combining elements, wherein one of the two combining elements is connected between one of the two first edge portions of the first transparent substrate and one of the two second edge portions of the second transparent substrate corresponding to the one of the two first edge portions, and the other of the two combining elements is connected between the other of the two first edge portions and the other of the two second edge portions corresponding to the other of the two first edge portions; and a frame, the frame having at least two side columns opposite to each other and separated from each other in a distance, the two side columns being engaged with the two combining elements respectively.

2. The electronic device of claim 1, wherein each of the two combining elements comprises a first engaging portion located at a side thereof far away from the self-emitting display panel, each of the two side columns comprises a second engaging portion, and the second engaging portion is engaged with the first engaging portion.

3. The electronic device of claim 1, wherein the one of the two combining elements has a fixing portion located in a space formed by the one of the two first edge portions of the first transparent substrate, the one of the two second edge portions of the second transparent substrate corresponding to the one of the two first edge portions and the self-emitting display panel, the other of the two combining elements has a fixing portion located in a space formed by the other of the two first edge portions of the first transparent substrate, the other of the two second edge portions of the second transparent substrate corresponding to the other of the two first edge portions and the self-emitting display panel.

4. The electronic device of claim 3, wherein each of the two combining elements further comprises two protruding portions protruded from the fixing portion outside the space, a receiving space is defined between each of the two protruding portions and the fixing portion, the receiving spaces are configured for receiving the two first edge portions and the two second edge portions respectively.

5. The electronic device of claim 4, wherein each of the two combining elements further comprises two extending portions, the two extending portions are respectively connected to the two protruding portions, one of the two extending portions covers a surface of the one of the two first edge portions far away from the self-emitting display panel, the other of the two extending portions covers a surface of the one of the two second edge portions far away from the self-emitting display panel.

6. The electronic device of claim 1, wherein a length of each of the two first edge portions is greater than a length of each of the two second edge portions, and each of the two combining elements is substantially located in an orthographic projection region of each of the two first edge portion on the corresponding one of the two second edge portions.

7. The electronic device of claim 1, wherein a length of each of the two first edge portions is greater than a length of each of the two second edge portions, and each of the two side columns and the corresponding one of the two combining elements are substantially located in an orthographic projection region of each of the two first edge portion on the corresponding one of the two second edge portions.

8. The electronic device of claim 1, wherein each of the first transparent substrate and the second transparent substrate is trapezoidal and has a top surface and a bottom surface, and the bottom surface of the first transparent substrate faces to the bottom surface of the second transparent substrate.

9. The electronic device of claim 1, wherein each of the first transparent substrate and the second transparent substrate is trapezoidal and has a top surface and a bottom surface, the top surface of the first transparent substrate faces to the top surface of the second transparent substrate.

10. The electronic device of claim 1, further comprising a plurality of light shielding layers disposed on two inner surfaces of the two first edge portions of the first transparent substrate and two inner surfaces of the two second edge portions of the second transparent substrate.

* * * * *